(12) United States Patent
Pudas

(10) Patent No.: US 11,761,082 B2
(45) Date of Patent: Sep. 19, 2023

(54) ALD APPARATUS, METHOD AND VALVE

(71) Applicant: Picosun Oy, Espoo (FI)

(72) Inventor: Marko Pudas, Espoo (FI)

(73) Assignee: Picosun Oy, Espoo (FI)

( * ) Notice: Subject to any disclaimer, the term of this patent is extended or adjusted under 35 U.S.C. 154(b) by 215 days.

(21) Appl. No.: 16/609,000

(22) PCT Filed: May 2, 2017

(86) PCT No.: PCT/FI2017/050336
§ 371 (c)(1),
(2) Date: Oct. 28, 2019

(87) PCT Pub. No.: WO2018/202935
PCT Pub. Date: Nov. 8, 2018

(65) Prior Publication Data
US 2020/0190666 A1 Jun. 18, 2020

(51) Int. Cl.
*C23C 16/455* (2006.01)
*C23C 16/44* (2006.01)
*F16K 1/44* (2006.01)

(52) U.S. Cl.
CPC .... *C23C 16/45544* (2013.01); *C23C 16/4402* (2013.01); *C23C 16/4405* (2013.01); *C23C 16/4408* (2013.01); *C23C 16/4557* (2013.01); *C23C 16/45519* (2013.01);
(Continued)

(58) Field of Classification Search
CPC .......... C23C 16/45544; C23C 16/4405; C23C 16/4408; C23C 16/45557; C23C 16/45561; C23C 16/4557; C23C 16/45589; C23C 16/4402; C23C 16/45519; C23C 16/45555; C23C 16/45568; C23C 16/45548; F16K 1/446
See application file for complete search history.

(56) References Cited

U.S. PATENT DOCUMENTS 3,643,679 A * 2/1972 Hansson ................. F16K 1/446
137/630.22
5,088,444 A 2/1992 Ohmine et al.
(Continued)

FOREIGN PATENT DOCUMENTS

CN 101040060 A 9/2007
CN 201482345 U 5/2010
(Continued)

OTHER PUBLICATIONS

European Patent Office, Supplementary Partial European Search Report, Application No. 17908402.5, dated Oct. 23, 2020, 15 pages.
(Continued)

*Primary Examiner* — Jeffrie R Lund
(74) *Attorney, Agent, or Firm* — ZIEGLER IP LAW GROUP, LLC

(57) ABSTRACT

An apparatus, a method and a valve with a reactive chemical inlet, a reaction chamber outlet, and a closure having an open and closed configuration to open and close, respectively, a route from the reactive chemical inlet to the reaction chamber outlet, the valve further including an additional cleaning chemical inlet at a downstream side of the closure to purge the closure.

30 Claims, 4 Drawing Sheets

(52) U.S. Cl.
CPC .. *C23C 16/45557* (2013.01); *C23C 16/45561* (2013.01); *C23C 16/45589* (2013.01); *F16K 1/446* (2013.01)

(56) References Cited

U.S. PATENT DOCUMENTS

| | | | |
|---|---|---|---|
| 6,056,003 A * | 5/2000 | Madsen | F16K 1/446 137/240 |
| 6,056,823 A * | 5/2000 | Sajoto | C23C 16/4401 118/715 |
| 6,572,924 B1 | 6/2003 | Halpin | |
| 6,916,398 B2 * | 7/2005 | Chen | C23C 16/4412 257/E21.171 |
| 8,741,062 B2 | 6/2014 | Lindfors et al. | |
| 9,029,244 B2 | 5/2015 | Won et al. | |
| 9,702,041 B2 | 7/2017 | Won et al. | |
| 2002/0076490 A1 * | 6/2002 | Chiang | H01J 37/32449 257/E21.171 |
| 2003/0010451 A1 | 1/2003 | Tzu et al. | |
| 2003/0101938 A1 * | 6/2003 | Ronsse | C23C 16/4401 118/712 |
| 2004/0118342 A1 * | 6/2004 | Cheng | C23C 16/455 118/715 |
| 2005/0106865 A1 | 5/2005 | Chung et al. | |
| 2005/0221004 A1 * | 10/2005 | Kilpela | C23C 16/45544 427/248.1 |
| 2005/0249876 A1 * | 11/2005 | Kawahara | C23C 16/45561 156/345.33 |
| 2005/0266682 A1 * | 12/2005 | Chen | C23C 16/45525 438/637 |
| 2007/0251452 A1 * | 11/2007 | Tanaka | H01L 21/28562 257/E21.171 |
| 2008/0257417 A1 * | 10/2008 | Thomaschki | F16K 1/446 137/266 |
| 2008/0264337 A1 | 10/2008 | Sano et al. | |
| 2009/0263578 A1 | 10/2009 | Lindfors et al. | |
| 2009/0263961 A1 | 10/2009 | Kher | |
| 2010/0266765 A1 | 10/2010 | White et al. | |
| 2013/0133703 A1 * | 5/2013 | Nishijima | C23C 16/4482 134/108 |
| 2013/0160709 A1 | 6/2013 | White et al. | |
| 2013/0192690 A1 * | 8/2013 | Neuhauser | F16K 1/443 137/237 |
| 2013/0239889 A1 | 9/2013 | Lien et al. | |
| 2013/0327266 A1 | 12/2013 | Arena et al. | |
| 2013/0333768 A1 | 12/2013 | Chandrasekharan et al. | |
| 2014/0003892 A1 | 1/2014 | Yamamoto et al. | |
| 2014/0103145 A1 | 4/2014 | White et al. | |
| 2014/0308445 A1 | 10/2014 | Na et al. | |
| 2015/0099066 A1 | 4/2015 | Huotari et al. | |
| 2015/0152969 A1 | 6/2015 | Yogo et al. | |
| 2015/0284848 A1 | 10/2015 | Nakano et al. | |
| 2015/0299858 A1 * | 10/2015 | Yudovsky | C23C 16/4408 427/255.28 |
| 2015/0299859 A1 | 10/2015 | Kilpi et al. | |
| 2016/0097119 A1 | 4/2016 | Cui et al. | |
| 2016/0147234 A1 | 5/2016 | Leeser et al. | |
| 2016/0230933 A1 | 8/2016 | Chism et al. | |
| 2016/0281234 A1 | 9/2016 | Won et al. | |
| 2017/0088952 A1 | 3/2017 | Hawryluk | |
| 2018/0099304 A1 * | 4/2018 | Kilpi | C23C 16/45542 |
| 2019/0112707 A1 * | 4/2019 | Liu | C23C 16/45523 |
| 2020/0181774 A1 * | 6/2020 | Pudas | C23C 16/45544 |
| 2020/0190666 A1 * | 6/2020 | Pudas | C23C 16/45568 |
| 2021/0087687 A1 * | 3/2021 | Malinen | C23C 16/45523 |

FOREIGN PATENT DOCUMENTS

| | | | | |
|---|---|---|---|---|
| CN | 102468111 A * | 5/2012 | | H01J 49/0013 |
| CN | 203639553 U | 6/2014 | | |
| CN | 104831255 A | 8/2015 | | |
| CN | 104955499 A * | 9/2015 | | A61M 1/16 |
| CN | 106319481 A | 1/2017 | | |
| CN | 106471298 A | 3/2017 | | |
| CN | 107148661 A | 9/2017 | | |
| GB | 895324 A | 5/1962 | | |
| GB | 1102281 A | 2/1968 | | |
| GB | 1335007 A | 10/1973 | | |
| JP | 2002519180 A * | 7/2002 | | |
| JP | 2011198897 A | 10/2011 | | |
| KR | 20010028218 A | 4/2001 | | |
| KR | 1020160082237 A | 7/2016 | | |
| WO | 8702598 A1 | 5/1987 | | |

OTHER PUBLICATIONS

International Search Report, Application No. PCT/FI2017/050336, dated Jan. 15, 2018, 7 pages.
Written Opinion of the International Searching Authority, Application No. PCT/FI2017/050336, dated Jan. 15, 2018, 6 pages.
European Patent Office, Extended European Search Report, Application No. 18794956.5, dated Nov. 27, 2020, 9 pages.
The Patent Office of the People's Republic of China, Notification of the First Office Action, Application No. 2017800901635, dated May 19, 2021, 6 pages.
The Patent Office of the People's Republic of China, Search Report, Application No. 2017800901635, dated May 11, 2021, 4 pages.
Taiwan Patent Office, Search Report, Application No. 107114894, dated Apr. 16, 2021, 1 page.
Korean Intellectual Property Office, Notice of Allowance for Patent, Application No. 10.2019-7035330, dated Apr. 28, 2022, 2 pages.
United States Patent and Trademark Office, Non-Final Office Action, U.S. Appl. No. 16/608,945, dated Mar. 11, 2022, 21 pages.
The Patent Office of the People's Republic of China, Notification of Fourth Office Action, ApplicatiOn No. 2018800274525, dated Nov. 10, 2022, 7 pages, English Translation, 2 pages.
The Patent Office of the People's Republic of China, Search Report, Application No. 2018800274525, dated Nov. 10, 2022, 2 pages.

* cited by examiner

ALD APPARATUS, METHOD AND VALVE

FIELD

The aspects of the disclosed embodiments generally relate to substrate processing methods and apparatus, in particular to chemical deposition methods and deposition reactors. More particularly, but not exclusively, the aspects of the disclosed embodiments relate to atomic layer deposition (ALD) reactors with pulsing valve(s) attached to a reaction chamber.

BACKGROUND

This section illustrates useful background information without admission of any technique described herein representative of the state of the art.

ALD is based on strictly separated pulses of gases. Precursor gases that are released into a reaction chamber should react with each other on a substrate surface. Any reaction in gas phase is not preferred. The number of pulsing valves required to feed in reactive chemical(s) depends on used technology. In the case of photon-enhanced or plasma-assisted processes only a single pulsing valve may be needed while in conventional processes a plurality of pulsing valves are used. In order to achieve the highest quality required for modern semiconductor products there should not be mixing of precursor gases, in the gas phase, not even in ppm scale. Any such mixing is likely to cause particle formation, and is thus likely to cause damage on patterns on the substrate.

The conventional approach to prevent the mixing of the gases is to purge the reaction chamber and related gas lines a sufficiently long time. However, as the ALD pulses may need repeating thousands of times, and the purge time is directly increasing the process time, having long purge times is not an optimum solution. Also, certain precursor chemicals start to decompose quickly in the used temperatures, and they cannot wait for the next chemical pulse for a long time.

U.S. Pat. No. 9,029,244 B2 demonstrates a 4-way valve solution for continuous purge gas flow where purge gas flows continuously along a purge gas line into a reaction chamber via the 4-way valve. However, due to the used valve design, the 4-way valve, when in closed state, contains a vertical cavity extending from the by-passing purge gas line to a valve diaphragm. The space formed by the cavity is sufficient to contain in it or absorb on its walls an undesired amount of precursor chemicals. Fluid passing by along the purge gas line will create turbulence in the described cavity, and there is a risk that precursor chemical trapped within the cavity is sucked by the by-passing purge gas flow towards the substrate and cause undesirable particle formation on substrate surface.

SUMMARY

It is an object of embodiments of the present disclosure to provide an improved apparatus and method with no trapped precursor chemical thereby avoiding undesired particle generation, while enabling high pulsing speed, or at least to provide an alternative to existing technology.

According to a first example aspect of the disclosed embodiments there is provided an apparatus, comprising:
a reaction chamber;
a pulsing valve attached to the reaction chamber, the pulsing valve comprising:
a reactive chemical inlet;
a reaction chamber outlet; and
a closure having an open and closed configuration to open and close, respectively,
a route from the reactive chemical inlet to the reaction chamber outlet, the apparatus further comprising:
an additional cleaning chemical inlet at the reaction chamber side of the closure to purge the closure.

In certain example embodiments, the closure provides a valve output surface pointing to or towards the reaction chamber, and the apparatus comprises the additional cleaning chemical inlet to purge the valve output surface.

In certain example embodiments, the valve output surface is the surface of the closure pointing to an output direction of the reaction chamber outlet. Accordingly, in certain example embodiments, the valve output surface is defined as a part of the closure pointing towards the reaction chamber (reaction chamber interior, or substrate). In certain example embodiments, the closure is a closing member, such as a membrane, a diaphragm, or an orifice plunger. In certain example embodiments, the closure or closing member is of solid material. In other embodiments, the closure is of non-solid material, such as fluid, or a combination of solid and non-solid material. Accordingly, the closure may be alternatively implemented by, for example, a drop of liquid metal capable of closing the route from the reactive chemical inlet to the reaction chamber outlet. In certain example embodiments, the membrane (or other closure) is facing the substrate, or reaction chamber interior. The expression membrane is to be considered interchangeable with closure, and with its different forms, such as plunger or fluid closure.

In certain example embodiments, the closure and/or valve output surface is in a fluid-flowing-pass contact with a cleaning chemical, or inert gas.

In certain example embodiments, the additional cleaning chemical inlet points directly or at least obliquely to the closure and/or valve output surface.

In certain example embodiments, the additional cleaning chemical inlet points towards the closure and/or valve output surface from the reaction chamber side of the closure.

In certain example embodiments, the reaction chamber outlet provides a reaction chamber outlet channel towards the reaction chamber. In certain example embodiments, the reaction chamber outlet, or reaction chamber outlet channel, provides an opening towards the reaction chamber. The reaction chamber outlet of the pulsing valve in an example embodiment opens directly, without an intermediate part, to an interior of the reaction chamber.

In certain example embodiments, the additional cleaning chemical input is additional to the parts the pulsing valve would typically have. Accordingly, in certain example embodiments, the additional cleaning chemical input is additional to the reaction chamber outlet and/or reaction chamber outlet channel.

In certain example embodiments, the apparatus comprises the additional cleaning chemical inlet in a reaction chamber outlet channel wall.

In certain example embodiments, the apparatus comprises a pipe (cleaning chemical inlet pipe) extending towards the closure and/or valve outlet surface within the reaction chamber outlet channel, the pipe providing the additional cleaning chemical inlet.

In certain example embodiments, inert purge gas is directed to the proximity of the membrane with a pipe from the same space as the reaction space.

In certain example embodiments, the apparatus is configured to provide continuous purge of the closure and/or valve output surface.

In certain example embodiments, the apparatus is configured to provide purge along the closure and/or valve output surface.

In certain example embodiments, the flow direction of the cleaning chemical is first perpendicular to or oblique with respect to the closure and/or valve output surface, and upon hitting the closure and/or valve output surface the flow direction turns in parallel to the closure and/or valve output surface. When the cleaning chemical subsequently exits into the direction of the reaction chamber, also the remainder of the reaction chamber outlet channel becomes purged.

In certain example embodiments, the apparatus comprises a pulsing valve or other means, such as mass flow controller, to change the cleaning chemical flow rate as needed. In certain example embodiments, the cleaning chemical flow is synchronized with reactive chemical pulses.

In certain example embodiments, the apparatus provides for a first flow path via the pulsing valve to the reaction chamber, and has a second flow path intersecting the first flow path at the valve output surface to purge the valve output surface.

In certain example embodiments, the apparatus comprises a heated outer chamber around the reaction chamber.

In certain example embodiments, the apparatus comprises the pulsing valve in a heated intermediate space within the outer chamber but on the outside of the reaction chamber.

In certain example embodiments, the pulsing valve comprises a chemical waste line outlet.

In certain example embodiments, the apparatus provides a route by-passing the closure from the reactive chemical inlet to the waste line outlet that route being open in the closed configuration of the closure.

In certain example embodiments, the apparatus is configured to maintain a higher pressure in a chemical waste line beginning at the waste line outlet compared to a pressure in the reaction chamber.

In certain example embodiments, the closure is configured to prevent reactive chemical from flowing into the chemical waste line outlet when being in the open configuration.

In certain example embodiments, the chemical waste line comprises a flow restrictor that may be a narrow passage or a capillary.

In certain example embodiments, the apparatus comprises an outlet other than the reaction chamber outlet. The other outlet may be the aforementioned waste line outlet. In certain example embodiments, the other outlet is connected to a same foreline, or exhaust line, to which the reaction chamber is connected. In certain example embodiments, the other outlet is connected to the same foreline, via a trap (for chemical neutralization or combustion) positioned before the connection to the foreline. In certain example embodiments, the other outlet is connected to a different foreline. In certain example embodiments, the other outlet is connected to a precursor chemical recovery arrangement.

In certain example embodiments, the pulsing valve is embedded into or attached to a structure selected from a group comprising: a structure leading to a reaction chamber, a reaction chamber structure, a reaction chamber wall, and a reaction chamber lid. In certain example embodiments, there are a plurality of pulsing valves embedded into or attached to a plurality of structures selected from a group comprising: a reaction chamber structure, a reaction chamber wall, and a reaction chamber lid.

Accordingly, in certain example embodiments, the pulsing valve is positioned inside or at least partly inside of the reaction chamber structure or wall. In certain example embodiments, a reaction chamber structure is a structure defining the reaction chamber, such as a reaction chamber wall or lid.

In certain example embodiments, the apparatus comprises a plurality of additional cleaning chemical inlets at the reaction chamber side of the closure to purge the closure. In yet further example embodiments, the closure is a non-completely closing member thereby not closing the route from the reactive chemical inlet to the reaction chamber outlet completely when being in closed configuration.

In certain the pulsing valve connects to the reaction space without there being a pipeline in between. In certain example embodiments, the pulsing valve opens directly into the reaction space defined by the reaction chamber. In certain example embodiments, the pulsing valve reaction chamber outlet directly connects to inside of the reaction space by an expansion volume, or a passage widening towards the reaction space, and/or by a showerhead. In certain example embodiments, the route from the route from the pulsing valve to the reaction space is without bends. In certain example embodiments, the pulsing valve is a surface part of the reaction chamber (the reaction chamber defining the reaction space accommodating at least one substrate).

In certain example embodiments, the apparatus is a substrate processing apparatus. In certain example embodiments, the apparatus is a deposition reactor. In certain example embodiments, the apparatus is a chemical deposition reactor. In certain example embodiments, the apparatus is an ALD reactor.

According to a second example aspect of the disclosed embodiments there is provided a method, comprising:

supplying reactive chemical through a pulsing valve along a route extending from a reactive chemical inlet to a reaction chamber outlet;

controlling the closing of the route by a pulsing valve closure; and supplying cleaning chemical through an additional cleaning chemical inlet at the reaction chamber side of the closure and purging the closure by the cleaning chemical.

In certain example embodiments, the method comprises: purging a valve output surface provided by the closure that is pointing towards or directly to the reaction chamber, or substrate, by cleaning chemical released from the additional cleaning chemical inlet that is additional to the reaction chamber outlet.

In certain example embodiments, said supplying of cleaning chemical comprises releasing cleaning chemical onto pulsing valve output surface which cleaning chemical reacts with reactive chemicals on the surface without producing solid particles.

In certain example embodiments, the additional cleaning chemical inlet points directly or at least obliquely to the closure and/or valve output surface.

In certain example embodiments, the method comprises providing the additional cleaning chemical inlet in a reaction chamber outlet channel wall.

In certain example embodiments, the method comprises: supplying the cleaning chemical from a pipe extending towards the closure and/or valve outlet surface within the reaction chamber outlet channel, the pipe providing the additional cleaning chemical inlet.

In certain example embodiments, the method comprises: purging the closure and/or valve output surface continuously.

In certain example embodiments, the method comprises: purging along the closure and along the reaction chamber outlet channel wall.

In certain example embodiments, the method comprises: heating an outer chamber around the reaction chamber.

In certain example embodiments, the method comprises: providing a route by-passing the closure from the reactive chemical inlet to a waste line outlet that route being open in the closed configuration of the closure.

In certain example embodiments, the method comprises: maintaining a higher pressure in a chemical waste line beginning at the waste line outlet compared to a pressure in the reaction chamber.

In certain example embodiments, the method comprises: completely preventing or at least partly preventing reactive chemical from flowing into the chemical waste line outlet when the closure is in the open configuration.

In certain example embodiments, the method comprises: performing ALD deposition within the reaction chamber.

According to a third example aspect of the disclosed embodiments there is provided a valve for use in the apparatus of the first aspect and any of its embodiments, the valve comprising:
a reactive chemical inlet;
a reaction chamber outlet; and
a closure having an open and closed configuration to open and close, respectively,
a route from the reactive chemical inlet to the reaction chamber outlet, the valve further comprising:
an additional cleaning chemical inlet at a downstream side of the closure to purge the closure.

Different non-binding example aspects and embodiments of the present disclosure have been illustrated in the foregoing. The above embodiments are used merely to explain selected aspects or steps that may be utilized in implementations of the present disclosure. Some embodiments may be presented only with reference to certain example aspects of the disclosed embodiments. It should be appreciated that corresponding embodiments apply to other example aspects as well. Any appropriate combinations of the embodiments may be formed.

BRIEF DESCRIPTION OF THE DRAWINGS

The aspects of the disclosed embodiments will now be described, by way of example only, with reference to the accompanying drawings, in which.

DETAILED DESCRIPTION

In the following description, Atomic Layer Deposition (ALD) technology is used as an example. However, the aspects of the disclosed embodiments are not limited to ALD technology, but it can be exploited in a wide variety of substrate processing apparatuses, for example, in Chemical Vapor Deposition (CVD) reactors.

The basics of an ALD growth mechanism are known to a skilled person. ALD is a special chemical deposition method based on the sequential introduction of at least two reactive precursor species to at least one substrate. It is to be understood, however, that one of these reactive precursors can be substituted by energy when using, for example, photon-enhanced ALD or plasma-assisted ALD, for example PEALD, leading to single precursor ALD processes. For example, deposition of a pure element, such as metal, requires only one precursor. Binary compounds, such as oxides can be created with one precursor chemical when the precursor chemical contains both of the elements of the binary material to be deposited. Thin films grown by ALD are dense, pinhole free and have uniform thickness.

The at least one substrate is typically exposed to temporally separated precursor pulses in a reaction vessel to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition) plasma-assisted ALD, for example PEALD (Plasma Enhanced Atomic Layer Deposition) and photon-enhanced Atomic Layer Deposition (known also as flash enhanced ALD).

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. All these deposition cycles form a timed deposition sequence that is controlled by a logic unit or a microprocessor.

A reaction space is a defined volume within a reaction chamber. The desired chemical reactions occur in the reaction space. Basic ALD inlet tools through which chemicals are flown into the reaction space are generally knows as shower heads. The inlet of precursor chemical can be from the top, or cross flow, where the chemical is inlet from at least one side.

Figure 1:
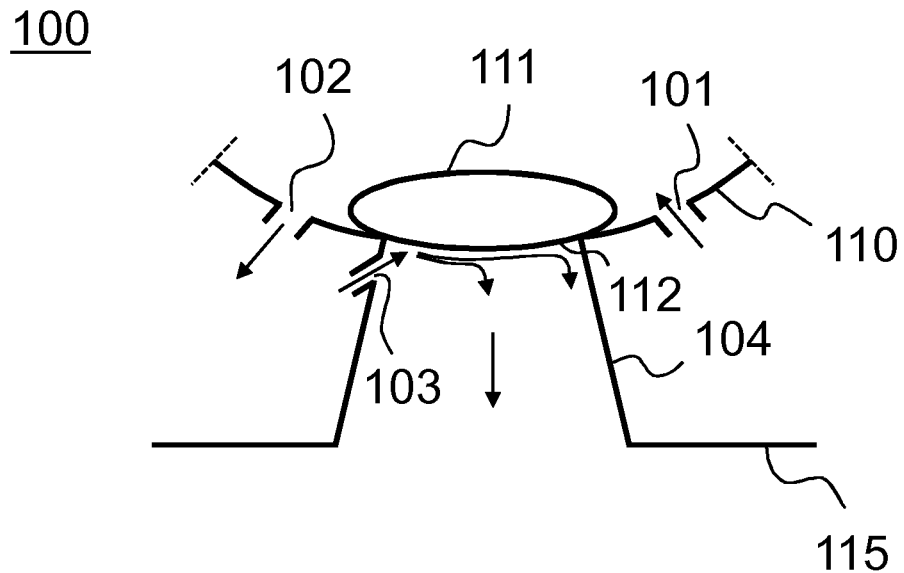
FIG. 1 shows a pulsing valve with its closure in a closed configuration in accordance with certain example embodiments of the present disclosure.

FIG. 1 shows a pulsing valve with its closure in a closed configuration in accordance with certain example embodiments of the present disclosure. The pulsing valve 100 comprises a valve body 110 having an inlet 101 for reactive chemical, such as a precursor chemical, and an outlet 104 towards a reaction chamber (not shown in FIG. 1). A closure 111 comprised by the pulsing valve has an open and closed configuration to open and close, respectively, a route from the reactive chemical inlet 101 to the reaction chamber outlet 104. FIG. 1 shows the closure 111 in its closed configuration.

A surface of the closure 111 pointing towards the reaction chamber is defined as a valve output surface 112. The pulsing valve 100 further comprises an additional cleaning chemical inlet 103 at the reaction chamber side of the closure 111 to purge the closure 111, especially the valve output surface 112, to prevent or minimize material growth thereon thus providing a cleaning effect. The same effect is achieved on side walls of the outlet (or outlet channel, or opening) 104 when the cleaning chemical exits along the side walls towards the reaction chamber. In certain example embodiments, the cleaning chemical inlet 103 is implemented through the side wall of the outlet 104. A cleaning chemical inlet pipe or channel travelling within the valve body passes through the side wall and points towards the closure 111 and/or valve output surface 112.

The cleaning chemical can be the same gas that is used as the purging gas in the reaction chamber during process stage. Cleaning chemical is led to inlet 103 via a route that is separate from the routes the other chemicals use. In certain example embodiments, the cleaning chemical route has pulsing control, mass flow control, and/or valve control to change and/or limit the flow of cleaning chemical with respect to pulses in process stage.

The pulsing valve 100 further comprises an optional chemical waste line outlet 102. A route by-passing the closure 111 is formed from the reactive chemical inlet 101 to the waste line outlet 102.

The pulsing valve 100 may be attached to and/or sealed with a reaction chamber structure of a substrate processing apparatus at its attaching surface 115.

Figure 2:
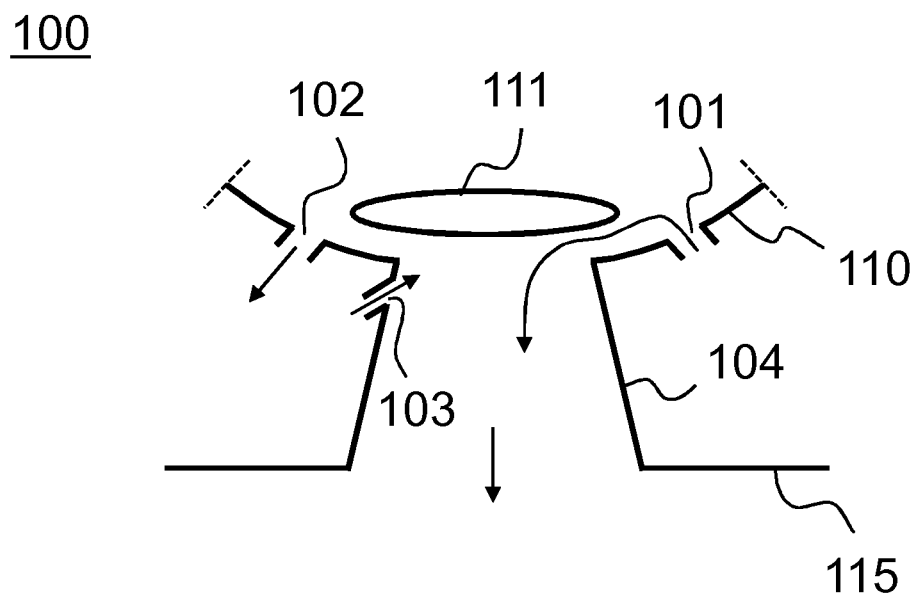
FIG. 2 shows the pulsing valve of FIG. 1 with its closure in an open configuration.

FIG. 2 shows the pulsing valve 100 with its closure 111 in an open configuration. The reactive chemical flows from the reactive chemical inlet 101 to the reaction chamber outlet 104.

Figure 3:
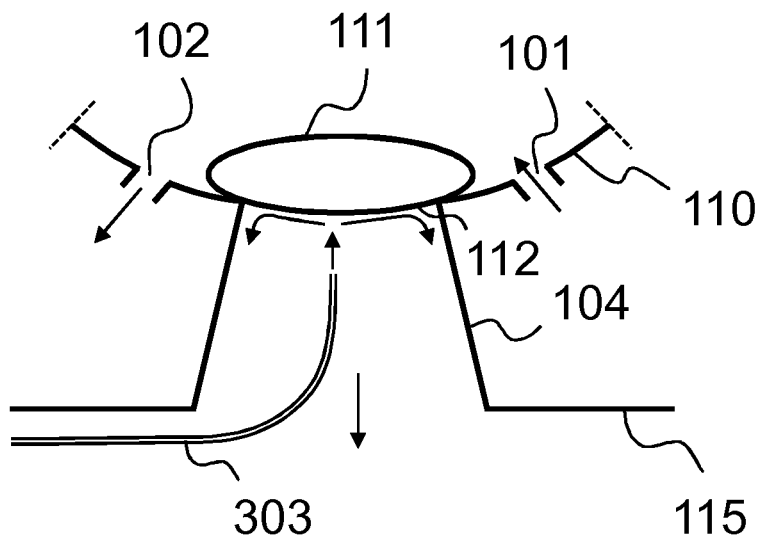
FIG. 3 shows a pulsing valve with its closure in a closed configuration in accordance with certain other example embodiments of the present disclosure.

FIG. 3 shows a pulsing valve with its closure in a closed configuration in accordance with certain other example embodiments of the present disclosure. The pulsing valve 300 comprises a valve body 110 having an inlet 101 for reactive chemical, such as a precursor chemical, and an outlet 104 towards a reaction chamber (not shown in FIG. 3). A closure 111 comprised by the pulsing valve has an open and closed configuration to open and close, respectively, a route from the reactive chemical inlet 101 to the reaction chamber outlet 104. FIG. 3 shows the closure 111 in its closed configuration.

A surface of the closure 111 pointing towards the reaction chamber is, again, defined as a valve output surface 112. The pulsing valve 300 further comprises an additional cleaning chemical inlet 303 at the reaction chamber side of the closure 111 to purge the closure 111, especially the valve output surface 112, to prevent or minimize material growth thereon thus providing a cleaning effect. The same effect is achieved on side walls of the outlet (or outlet channel, or opening) 104 when the cleaning chemical exits along the side walls towards the reaction chamber. In certain example embodiments, the cleaning chemical inlet 103 is implemented as a separate pipeline extending within the outlet 104 towards the closure 111 and/or valve output surface 112.

The pulsing valve 300 further comprises an optional chemical waste line outlet 102. A route by-passing the closure 111 is formed from the reactive chemical inlet 101 to the waste line outlet 102.

The pulsing valve 300 may be attached to a reaction chamber structure of a substrate processing apparatus at its attaching surface 115. As to the operation of the pulsing valve 300 a reference is made to the preceding description in connection with pulsing valve 100.

Figure 4:
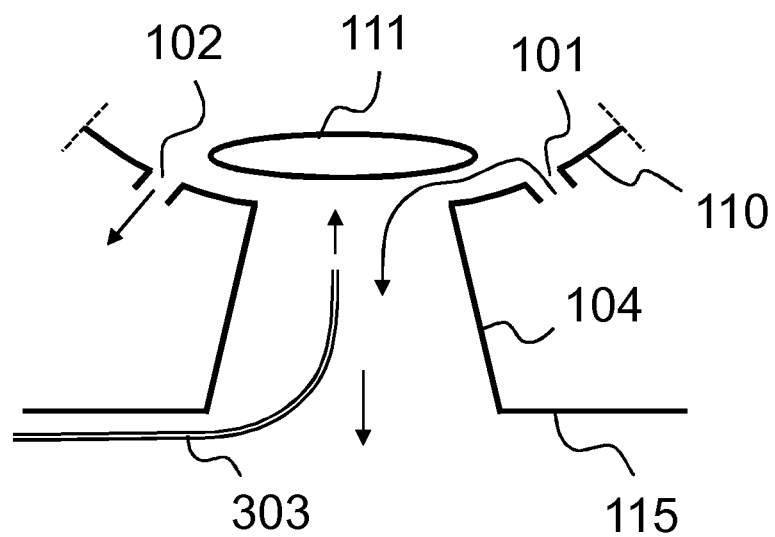
FIG. 4 shows the pulsing valve of FIG. 3 with its closure in an open configuration.

FIG. 4 shows the pulsing valve 300 with its closure 111 in an open configuration. The reactive chemical flows from the reactive chemical inlet 101 to the reaction chamber outlet 104.

Figure 5:
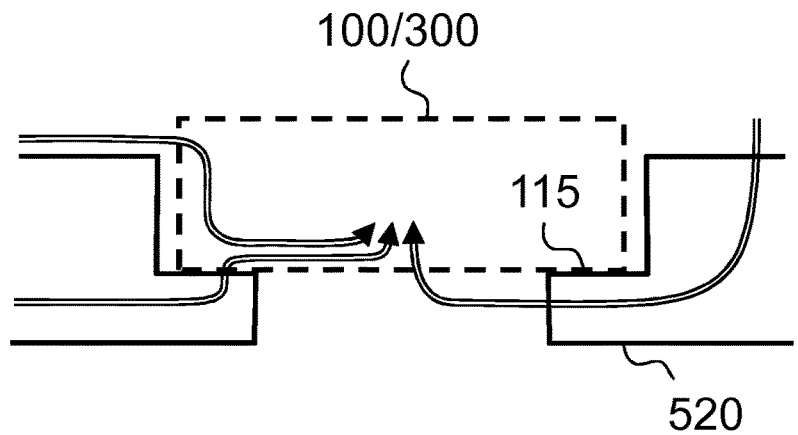
FIG. 5 shows a pulsing valve attached to a reaction chamber structure in accordance with certain example embodiments of the present disclosure.

FIG. 5 shows a pulsing valve attached to a reaction chamber structure in accordance with certain example embodiments of the present disclosure. The pulsing valve 100 (300) may form part of the surface of the reaction chamber. In certain example embodiments, the reaction chamber structure 520 comprises a recess into which the pulsing valve 100 (300, similarly) is embedded. The pulsing valve 100 (300) may be tightened against the structure 520 at the attaching surface 115. In certain example embodiments, the pulsing valve is attached to a reaction chamber wall. In certain example embodiments, the pulsing valve is attached to a reaction chamber side wall. FIG. 5 specifically shows an embodiment in which the pulsing valve is embedded into reaction chamber upper wall, or lid.

In certain example embodiments, the pulsing valve forms an integral part of the reaction chamber. In other example embodiments, the pulsing valve is attached to a pipe or other structure leading to a reaction chamber.

FIG. 5 further shows by arrows certain routing alternatives to implement a route of the cleaning chemical inlet pipe (or channel). The pipe can for part of the valve structure and/or the reaction chamber lid and/or wall structure, or it can be a separate pipe attached to or through the reaction chamber lid/wall. The route can extend in parallel of the reaction chamber lid or wall structure on the outside of the structure, and/or it can penetrate through the structure into the reaction chamber side of the structure, and/or it can extend within the lid or wall structure and/or within the valve body. The other pipings, such as the reactive chemical in-feed piping, can be implemented similarly.

Figure 6:
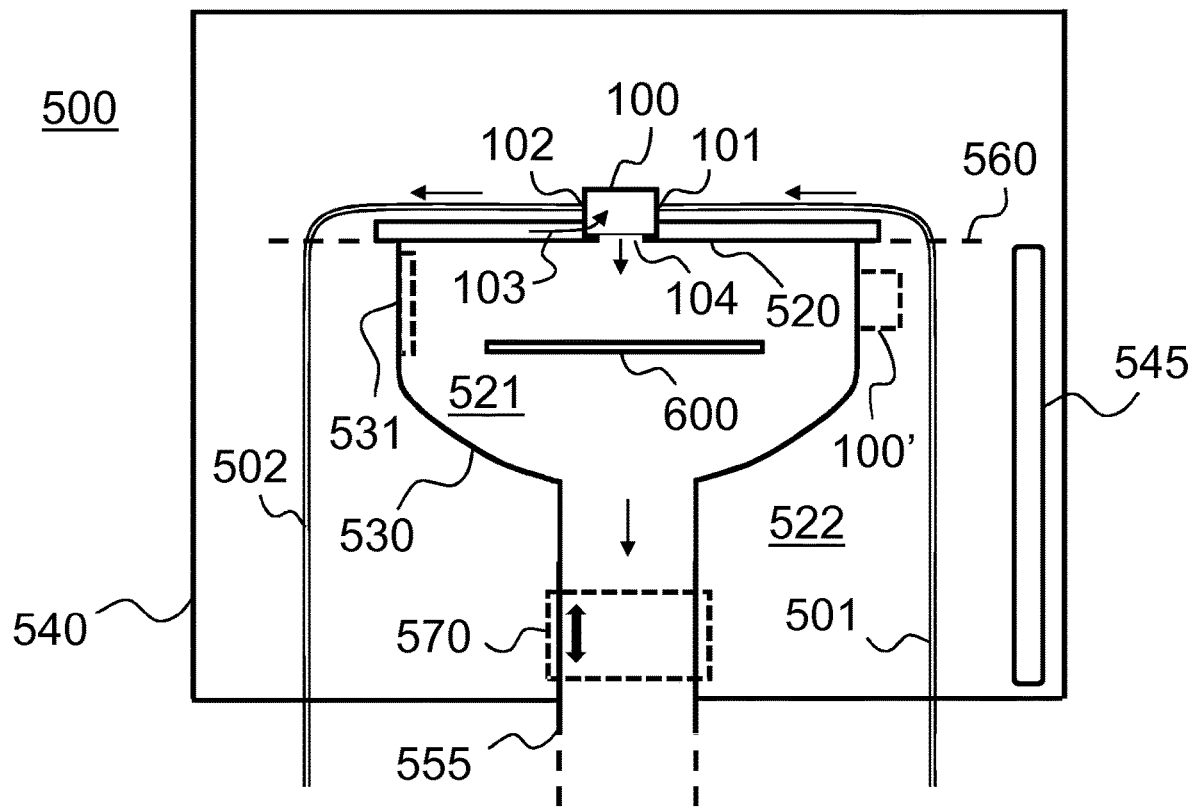
FIG. 6 shows a substrate processing apparatus in accordance with certain example embodiments of the present disclosure.

FIG. 6 shows a substrate processing apparatus in accordance with certain example embodiments of the present disclosure. The substrate processing apparatus 500 comprises a reaction chamber 530 configured to house a substrate 600 within a reaction space 521 defined by the reaction chamber 530. In certain example embodiments, the apparatus comprises an outer chamber 540 surrounding the reaction chamber 530 thereby closing an intermediate space 522 in between the reaction chamber 530 and the outer chamber 540. In certain example embodiments, the intermediate space 522 is heated by a heater 545 positioned in the space 522.

A reactive chemical in-feed line 501 (which may contain a plurality of pipes) extends from a reactive chemical source (not shown) via the intermediate space (if any) to the reactive chemical inlet (see FIGS. 1-4, inlet 101) of the pulsing valve 100. A chemical waste line 502 extends from the chemical waste line outlet (see FIGS. 1-4, outlet 102) of the pulsing valve 100 via the intermediate space (if any) to exhaust. The waste line 502 in certain example embodiments joins to an exhaust line 555 that extends from the reaction chamber 530 to a vacuum pump (not shown).

The pulsing valve 100 has similar structure and operation as described in connection of FIGS. 1 and 2. Accordingly, the pulsing valve 100 comprises a valve body having an inlet for reactive chemical, and an outlet towards the reaction chamber 530. A closure comprised by the pulsing valve has an open and closed configuration to open and close, respectively, a route from the reactive chemical inlet to the reaction chamber outlet. The pulsing valve 100 further comprises the additional cleaning chemical inlet at the reaction chamber side of the closure to purge the closure. The pulsing valve 100 further comprises the optional chemical waste line outlet. A route by-passing the closure is formed from the in-feed line 501 via the reactive chemical inlet to the waste line 502 via the waste line outlet.

Although there is only one pulsing valve shown in FIG. 6 it is clear that there may be a plurality of pulsing valves with similar structural and operational features, and/or one or more other pulsing valves with different known structures. Instead of the pulsing valve 100, the pulsing valve(s) 300 described in connection with FIGS. 3 and 4 may be used. The pulsing valve(s) may be positioned at the side wall of the reaction chamber 530, as illustrated by reference numeral 100', or they may be positioned at the lid structure or upper wall 520, or both at the side wall and at the lid structure/upper wall 520. In certain example embodiments, at least one pulsing valve can be positioned inside of the reaction chamber 530. In certain example embodiments, all of the one or more pulsing valves are positioned at the side wall and the reaction chamber is open from the top to receive energy needed in surface reactions at the substrate surface from the top, wherein the energy may be in the form of plasma or photons, for example.

In certain example embodiments, the reaction chamber 530 comprises a hatch 531 at its side wall for loading and unloading substrates. The structure 520 may be a fixed chamber upper wall or a removable lid. In certain example embodiments, the structure 520 is a removable lid. The substrate or substrates 600 are loaded from the top side of the reaction chamber by lifting the lid 520. A preferred position of the pulsing valve(s) is then at the side wall. In the event the removable lid has pulsing valve(s) at the lid, the pipings 501 and 502 can be designed to connect and disconnect if needed, for example at line 560 in FIG. 6. In certain example embodiments, the reaction chamber 520 is lowered, for example, by a bellows structure 570 to form a substrate loading route in between the chamber 530 and lid 520. A similar arrangement has been described in a copending international application PCT/FI2017/050071 filed by the same application. This enables loading from the side of the reaction chamber.

Figure 7:
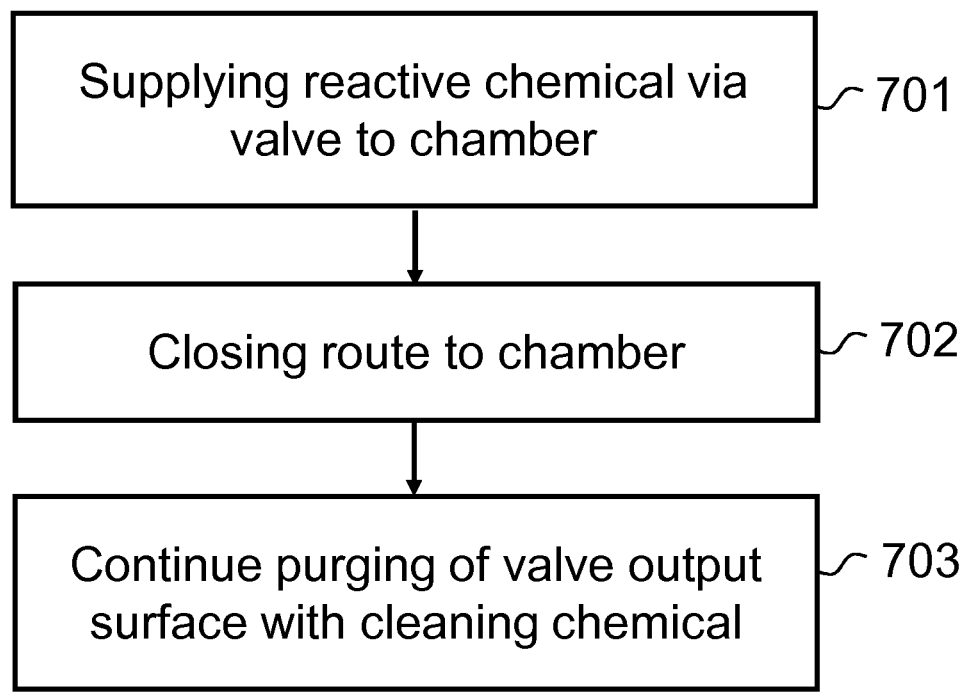
FIG. 7 shows a method according to certain example embodiments of the present disclosure.

FIG. 7 shows a method according to certain example embodiments of the present disclosure. In step 701, reactive chemical is supplied to a reaction chamber via a pulsing valve for deposition. The supply of reactive chemical to the reaction chamber is interrupted in step 702. The valve output surface is purged by cleaning chemical, and the purging by cleaning chemical is continued in step 703.

In certain example embodiments, a reactive chemical pulse into the reaction chamber is followed by a cleaning chemical period. The cleaning chemical may be gas or fluid. In certain example embodiments, the cleaning chemical flows continuously. In certain example embodiments, the flow rate of cleaning chemical is reduced at least during a part of a precursor chemical pulse. In certain example embodiments, the cleaning chemical flows at an elevated rate during a period in which precursor vapor is not released into the reaction chamber via the pulsing valve in question.

The cleaning chemical can refer here to a gas or fluid, which can push fluid atoms or molecules away from a space, and/or which can remove them from surfaces. The cleaning chemical can be neutral, such as argon gas Ar, or nitrogen gas N2, or reactive, such as heated gas, or ionized or radical gas. It can be any such gas which does not react with the reactive chemical, or it can be any such gas which reacts with the chemical to be cleaned in a way that it does not produce solid species (or in some cases neither liquid species, which would react with the substrate). In certain example embodiments, the cleaning gas can be helium gas He. Some or all of the gases can be considered as carrier gases.

Figure 8:
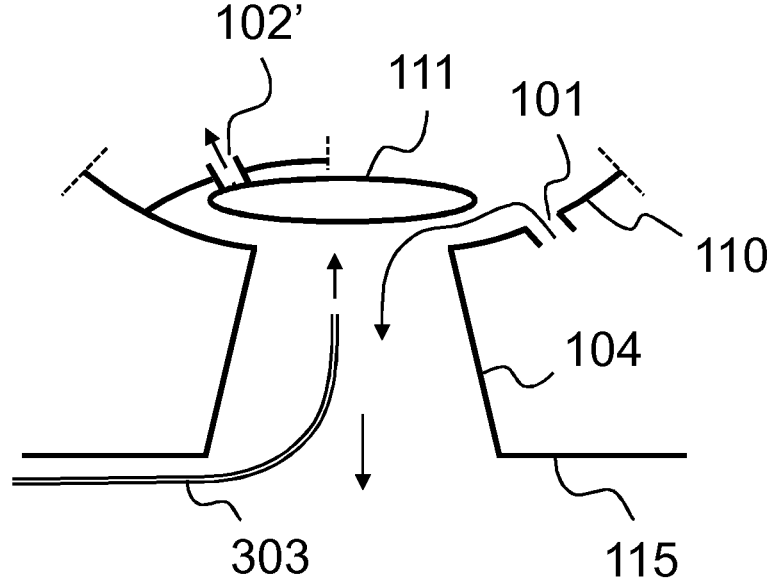
FIG. 8 shows yet another example embodiment of the present disclosure.

In certain or all foregoing embodiments, the following applies:

chemical flowing into the inlet 101 may consist of pure precursor (or reactive) chemical, or a mixture of precursor chemical and carrier gas;

the flow and mixing of reactive gas to carrier gas can be controller with mass flow controller or valves synchronized with the whole process, or with any synchronization down to duration of a step of the deposition cycle, such as presented, for example, in U.S. Pat. No. 8,211,235 assigned to the same assignee;

the pulsing valve 100 or 300 may contain a flow restrictor, such as a capillary, in the optional waste line 502 within the valve area;

the valve 100 or 300 may be a 3-way valve or a 4-way valve in which a fluid flow hits the closure 111;

the fluid flow may be released from the additional cleaning chemical inlet positioned at a side of the valve (as in FIGS. 1 and 2), and/or the additional cleaning chemical inlet may be provided by a cleaning chemical inlet pipe coming from the outside of valve body (as in FIGS. 3 and 4);

the cleaning chemical inlet pipe may be heated, which heat may me higher than the reaction chamber heat;

the cleaning chemical inlet pipe may be provided with pre-heated gas;

the provided reaction chamber outlet channel (or opening) 104 towards the reaction chamber may be the only inlet to the reaction chamber (i.e., there are no other gas inlets to the reaction chamber)—this outlet channel may provide all chemicals needed in the reactions within the reaction chamber;

the pulsing valve may be oriented such that the closure 111 faces (or sees) the reaction space (or substrate surface);

the opening may expand from the closure surface towards the reaction chamber the expansion may be in the form of a conical opening;

the pulsing valve may form part of the reaction chamber (or reaction vessel) structure—the reaction chamber structure may be a reaction chamber lid the pressure in the intermediate space 522 pressure may be 1000-0.1 mBar, preferably 100-1 mBar, more preferably 20-2 mBar.

the reaction chamber pressure may be ambient to 1 μBar, more preferably 10-0.01 mBar, most preferably 1-0.1 mBar.

the reaction chamber pressure can be varied with the aid of modifying the vacuum in foreline (exhaust line) 555 leading out from the chamber 530, or by a total gas flow to the reaction space 521, and possibly intermediate space 522;

the reaction chamber pressure referred here can be synchronized with the whole process, or any synchronization down to duration of a step of the deposition cycle may be applied FIG. 8 shows yet another example embodiment of the present disclosure. The closure 111 can be configured to close the waste line outlet 102', or at least partly close the waste line outlet 102', or decrease the flow to the waste line, while the route from the reactive chemical inlet 101 to the reaction chamber outlet 104 is opened. The waste line outlet 102' may be positioned at the other side of the closure 111 so that when the closure 111 moves away from the reaction chamber outlet 104 it pushes against the waste line outlet (opening) 102'.

Yet in other embodiments, in a slightly modified valve design, the closure 111 will close the reactive chemical inlet (opening) 101 while it closes the passage to the reaction chamber, e.g., by pushing against the inlet 101. This is in order to evacuate reactive gas from the space above the closure 111 into the waste line. This is especially applicable if the closure 111 is not able to completely block the reactive chemical flow into the reaction chamber past the closure (i.e., when the closure 111 is not completely closing). The pressure in the space above the closure 111 is then lower compared to the pressure inside the reaction chamber and residual reactive chemical flows into the direction of the waste line.

The description concerning any particular preceding embodiment is directly applicable to other disclosed embodiments. This applies both with regard to the structure and operation of the disclosed apparatus.

Without limiting the scope and interpretation of the patent claims, certain technical effects of one or more of the example embodiments disclosed herein are listed in the following. A technical effect is providing a minimum amount of trapped precursor chemical thereby avoiding undesired particle generation, while enabling high pulsing speed, for example, more than one pulse and purge per second. Another technical effect is a mechanically smaller pulsing valve implementation, for example, less than 10 cm$^3$, such as 4 cm$^3$. Another technical effect is a cleaning effect by purging reactive material away from surfaces. Undesired gas phase reactions of material adsorbed on solid surfaces of the pulsing valve structure and pulsing valve outlet can be minimized.

It should be noted that some of the functions or method steps discussed in the preceding may be performed in a different order and/or concurrently with each other. Furthermore, one or more of the above-described functions or method steps may be optional or may be combined.

In the foregoing drawings 1-4, and 8 a space inside the valve 100 or 300 where the closure 111 is moved should in each case be consider to be a closed volume.

The foregoing description has provided by way of non-limiting examples of particular implementations and embodiments of the present disclosure a full and informative description of the best mode presently contemplated by the inventors for carrying out the aspects of the disclosed embodiments. It is however clear to a person skilled in the art that the aspects of the disclosed embodiments are not restricted to details of the embodiments presented above, but that it can be implemented in other embodiments using equivalent means without deviating from the characteristics of the present disclosure.

Furthermore, some of the features of the above-disclosed embodiments of the present disclosure may be used to advantage without the corresponding use of other features. As such, the foregoing description should be considered as merely illustrative of the principles of the present disclosure, and not in limitation thereof. Hence, the scope of the aspects of the disclosed embodiments are only restricted by the appended patent claims.

The invention claimed is:

1. An apparatus, comprising:
    a reaction chamber;
    a pulsing valve directly attached to the reaction chamber, the pulsing valve comprising:
    a reactive chemical inlet;
    a reaction chamber outlet; and
    a closure having an open and closed configuration to open and close, respectively, a route from the reactive chemical inlet to the reaction chamber outlet, the apparatus further comprising:
        an additional cleaning chemical inlet at the reaction chamber side of the closure to purge the closure,
        wherein the closure provides a valve output surface facing the reaction chamber outlet in the open configuration,
        wherein the valve output surface is purged in both the open configuration and in the closed configuration of the closure,
        and wherein in the closed configuration, the reactive chemical remains on a side of the closure other than a side of the closure providing the valve output surface.

2. The apparatus of claim 1, wherein the additional cleaning chemical inlet is configured to purge the valve output surface.

3. The apparatus of claim 1, wherein the additional cleaning chemical inlet points directly or at least obliquely to the closure and/or valve output surface.

4. The apparatus of claim 1, wherein the reaction chamber outlet provides a reaction chamber outlet channel towards the reaction chamber.

5. The apparatus of claim 4, comprising the additional cleaning chemical inlet in a reaction chamber outlet channel wall.

6. The apparatus of claim 4, comprising a pipe extending towards the closure and/or valve outlet surface within the reaction chamber outlet channel, the pipe providing the additional cleaning chemical inlet.

7. The apparatus of claim 1, wherein the apparatus is configured to provide continuous purge of the closure and/or valve output surface.

8. The apparatus of claim 1, wherein the apparatus is configured to provide purge along the closure and/or valve output surface.

9. The apparatus of claim 1, comprising a heated outer chamber around the reaction chamber.

10. The apparatus of claim 9, comprising the pulsing valve in a heated intermediate space within the outer chamber but on the outside of the reaction chamber.

11. The apparatus of claim 1, providing a route by-passing the closure from the reactive chemical inlet to the waste line outlet that route being open in the closed configuration of the closure.

12. The apparatus of claim 1, wherein the apparatus is configured to maintain a higher pressure in a chemical waste line beginning at the waste line outlet compared to a pressure in the reaction chamber.

13. The apparatus of claim 1, wherein the pulsing valve is embedded into or attached to a structure selected from a group comprising: a structure leading to a reaction chamber, a reaction chamber structure, a reaction chamber wall, and a reaction chamber lid.

14. The apparatus of claim 1, wherein the apparatus is an ALD reactor.

15. The apparatus of claim 1, wherein the pulsing valve comprises a chemical waste line outlet.

16. The apparatus of claim 15, wherein the closure is configured to prevent reactive chemical from flowing into the chemical waste line outlet when in the open configuration.

17. A method, comprising:
    supplying reactive chemical through a pulsing valve comprising a reactive chemical inlet, a reaction chamber outlet, and a closure having an open and closed configuration to open and close, respectively, a route from the reactive chemical inlet to the reaction chamber outlet, wherein the pulsing valve is directly attached to a reaction chamber;

controlling the closing of the route by pulsing the closure; and supplying cleaning chemical through an additional cleaning chemical inlet at the reaction chamber side of the closure and purging the closure by the cleaning chemical, purging a valve output surface provided by the closure that is facing the reaction chamber outlet in the open configuration; and purging the valve output surface in both the open configuration and in the closed configuration of the closure, wherein in the closed configuration, the reactive chemical remains on a side of the closure other than a side of the closure providing the valve output surface.

18. The method of claim 17, comprising:
purging the valve output surface provided by the closure by cleaning chemical released from the additional cleaning chemical inlet that is additional to the reaction chamber outlet.

19. The method of claim 17, wherein the additional cleaning chemical inlet points directly or at least obliquely to the closure and/or valve output surface.

20. The method of claim 17, comprising providing the additional cleaning chemical inlet in a reaction chamber outlet channel wall.

21. The method of claim 17, comprising
supplying the cleaning chemical from a pipe extending towards the closure and/or valve outlet surface within the reaction chamber outlet channel, the pipe providing the additional cleaning chemical inlet.

22. The method of claim 17, comprising:
purging the closure and/or valve output surface continuously.

23. The method of claim 17, comprising:
purging along the closure and along the reaction chamber outlet channel wall.

24. The method of claim 17, comprising:
heating an outer chamber around the reaction chamber.

25. The method of claim 17, comprising:
providing a route by-passing the closure from the reactive chemical inlet to a waste line outlet that route being open in the closed configuration of the closure.

26. The method of claim 25, comprising: maintaining a higher pressure in a chemical waste line compared to a pressure in the reaction chamber, which chemical waste line begins at the waste line outlet.

27. The method of claim 25, comprising:
completely preventing or at least partly preventing reactive chemical from flowing into the chemical waste line outlet when the closure is in the open configuration.

28. The method of claim 17, comprising:
performing ALD deposition within the reaction chamber.

29. The method of claim 17, wherein said supplying of cleaning chemical comprises releasing cleaning chemical onto pulsing valve output surface which cleaning chemical reacts with reactive chemicals on the surface without producing solid particles.

30. A pulsing valve directly attached to a reaction chamber, the pulsing valve, comprising:
a reactive chemical inlet;
a reaction chamber outlet; and
a closure having an open and closed configuration to open and close, respectively, a route from the reactive chemical inlet to the reaction chamber outlet, the valve further comprising:
an additional cleaning chemical inlet at a downstream side of the closure to purge the closure,
wherein the closure provides a valve output surface facing the reaction chamber outlet in the open configuration,
wherein the valve output surface is purged in both the open configuration and in the closed configuration of the closure,
and wherein in the closed configuration, the reactive chemical remains on a side of the closure other than a side of the closure providing the valve output surface.

* * * * *